(12) United States Patent
Tanaka et al.

(10) Patent No.: US 8,577,502 B2
(45) Date of Patent: Nov. 5, 2013

(54) LIQUID PROCESSING APPARATUS, LIQUID PROCESSING METHOD, COMPUTER PROGRAM, AND STORAGE MEDIUM

(75) Inventors: Hiroshi Tanaka, Tosu (JP); Hironobu Hyakutake, Tosu (JP); Yuji Kamikawa, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 1294 days.

(21) Appl. No.: 11/907,518

(22) Filed: Oct. 12, 2007

(65) Prior Publication Data
US 2008/0097647 A1    Apr. 24, 2008

(30) Foreign Application Priority Data
Oct. 18, 2006   (JP) ................. 2006-283185

(51) Int. Cl.
*G05B 21/00*    (2006.01)
*G01N 21/00*    (2006.01)
*G01N 35/02*    (2006.01)

(52) U.S. Cl.
USPC ............ 700/266; 700/275; 422/62; 422/68.1; 436/47; 436/54; 436/55

(58) Field of Classification Search
USPC .......... 422/62, 68.1; 436/47, 54, 55; 700/266, 700/275
See application file for complete search history.

(56) References Cited

U.S. PATENT DOCUMENTS 5,940,985 A * 8/1999 Kamikawa et al. ............ 34/471
6,203,627 B1   3/2001 Shindo et al.
6,575,178 B1   6/2003 Kamikawa
2001/0045224 A1* 11/2001 Kamikawa et al. ............ 134/61
2007/0175062 A1* 8/2007 Toshima et al. ................ 34/410

FOREIGN PATENT DOCUMENTS

| EP | 1 635 380 | 6/2003 |
|---|---|---|
| EP | 1 655 768 | 5/2006 |
| JP | 10-150013 | 6/1998 |
| JP | 2000-003895 | 1/2000 |
| JP | 2001-015468 | 1/2001 |

OTHER PUBLICATIONS

European Search Report issued on Jun. 15, 2009 for Application No. EP 07 02 0204.
Japanese Office Action, issued Mar. 22, 2011, with English translation.

* cited by examiner

*Primary Examiner* — Dean Kwak
(74) *Attorney, Agent, or Firm* — Smith, Gambrell and Russell, LLP

(57) ABSTRACT

A processing apparatus is provided for enhancing throughput in the manufacture of semiconductor wafers and/or liquid crystal substrates, by reducing the time required for performing a rinsing process. A position of an object to be processed is controlled, such that a distance between the surface position of a rinsing liquid upon the rinsing process and a top end position of the object to be processed becomes shorter than a distance between the surface position of a chemical liquid upon a chemical liquid process and the top end position of the object to be processed. Alternatively, the position of the object to be processed is controlled, such that the distance between the surface position of the rinsing liquid upon the rinsing process and the top end position of the object to be processed becomes shorter than a distance between the bottom face position of the rinsing liquid and a bottom end position of the object to be processed.

10 Claims, 7 Drawing Sheets

LIQUID PROCESSING APPARATUS, LIQUID PROCESSING METHOD, COMPUTER PROGRAM, AND STORAGE MEDIUM

CROSS REFERENCE OF RELATED APPLICATIONS

This application is based on the priority Japanese Patent Application No. 2006-283185 filed on Oct. 18, 2006, the entire contents of which are incorporated herein by reference.

BACKGROUND OF THE INVENTION

1. Field of the Invention

The present invention relates to a liquid processing apparatus, a liquid processing method, a computer program, and a storage medium, for carrying out a chemical liquid processing and a rinsing process, by dipping an object to be processed, such as a semiconductor wafer or liquid crystal substrate, in a chemical liquid or rising liquid, in a processing tank.

2. Background Art

In the past, a cleaning step, for providing a cleaning process to a semiconductor wafer(s) or liquid crystal substrate(s), has been carried out, in a manufacturing process for a semiconductor part or flat display. In the cleaning step, an object to be processed, such as a semiconductor wafer or liquid crystal substrate, is dipped in a chemical liquid in a processing tank, and the object to be processed is then dipped in a rinsing liquid in the processing tank, so as to clean its surface.

A liquid processing apparatus for use in the cleaning step, includes a processing tank and a supporting instrument configured to optionally move in the vertical direction in the processing tank and adapted to support the object to be processed. The object to be processed, which is supported by the supporting instrument in the processing tank, is dipped in a chemical liquid and/or rinsing liquid, so as to be subjected to a chemical liquid process and/or rinsing process (see, for example, Patent Document 1).

In the prior art liquid processing apparatus of this type, the chemical liquid is filled in advance in the processing tank, and the supporting instrument is lowered in the processing tank, so as to dip the object to be processed in the chemical liquid and provide the chemical liquid process to the object to be processed. Thereafter, without changing the level in the vertical direction of the supporting instrument, the rinsing process is performed, by replacing the chemical liquid with the rinsing liquid in the processing tank. Finally, the rinsing process is ended at a point of time the specific resistance of the rinsing liquid is detected to be higher than a predetermined value.

Patent Document 1: TOKUKAI No. 2000-3895, KOHO

However, in the prior art processing apparatus, because nitrogen gas and/or carbon dioxide gas in the air is dissolved into the surface of the rinsing liquid upon the rinsing process, unduly long time may be required for the specific resistance of the rinsing liquid to be raised up to the predetermined value, due to the effect of the dissolved nitrogen gas and/or carbon dioxide gas. Thus, the time required for the cleaning process may also be unduly long, as such deteriorating the throughput in manufacturing the semiconductor wafers or liquid crystal substrates.

SUMMARY OF THE INVENTION

After our extensive studies in order to address the above problem, we have found that the amount of dissolution of the nitrogen gas and/or carbon dioxide gas varies with the amount of the rinsing liquid existing between the surface of the rinsing liquid and a top end of the object to be processed, and that the time required for the specific resistance of the rinsing liquid to be raised up to a predetermined value can be shortened by reducing the distance between the surface of the rinsing liquid and the top end of the object to be processed. The present invention is based on the discovery.

The present invention is a liquid processing apparatus, comprising: a processing tank; a supporting instrument provided in the processing tank and configured to be raised and lowered, for supporting an object to be processed; a chemical liquid supply section for supplying a chemical liquid into the processing tank; a rinsing liquid supply section for supplying a rinsing liquid into the processing tank; a lifting mechanism configured to raise and lower the supporting instrument; and a control section for controlling the lifting mechanism, the chemical liquid supply section and the rinsing liquid supply section, wherein the control section controls the lifting mechanism, so as to move and hold the supporting instrument after performing a chemical liquid process using a chemical liquid, and performs a rinsing process using a rinsing liquid, in a position where the object to be processed is raised higher relative to the liquid surface than a level set upon the chemical liquid process.

The present invention is the liquid processing apparatus described above, wherein the control section controls the lifting mechanism to raise the supporting instrument, such that a distance between the surface position of the rinsing liquid upon the rinsing process and a top end position of the object to be processed becomes shorter than a distance between the surface position of the chemical liquid upon the chemical liquid process and the top end position of the object to be processed.

The present invention is the liquid processing apparatus described above, wherein the control section controls the lifting mechanism, so as to repeatedly raise and lower the supporting instrument upon the chemical liquid process, as well as to set an average position of the top end of the raised and lowered object to be processed as the top end position of the object to be processed upon the chemical liquid process.

The present invention is the liquid processing apparatus described above, wherein the control section controls the lifting mechanism, so as to repeatedly raise and lower the supporting instrument upon the chemical liquid process, as well as to set the highest position of the top end of the raised and lowered object to be processed as the top end position of the object to be processed upon the chemical liquid process.

The present invention is a liquid processing apparatus, comprising: a processing tank; a supporting instrument provided in the processing tank and configured to be raised and lowered, for supporting an object to be processed; a rinsing liquid supply section for supplying a rinsing liquid into the processing tank; a lifting mechanism configured to raise and lower the supporting instrument; and a control section for controlling the lifting mechanism and the rinsing supply section, wherein the control section controls the lifting mechanism, so as to transfer and hold the supporting instrument, such that a distance between the surface position of the rinsing liquid and a top end position of the object to be processed becomes shorter than a distance between the bottom face position of the rinsing liquid and a bottom end position of the object to be processed.

The present invention is a liquid processing method using a liquid processing apparatus, the liquid processing apparatus including: a processing tank; a supporting instrument provided in the processing tank and configured to be raised and lowered, for supporting an object to be processed; a chemical liquid supply section for supplying a chemical liquid into the processing tank; a rinsing liquid supply section for supplying a rinsing liquid into the processing tank; a lifting mechanism configured to raise and lower the supporting instrument; and a control section for controlling the lifting mechanism, the chemical liquid supply section and the rinsing liquid supply section, wherein the control section controls the lifting mechanism, so as to move and hold the supporting instrument after performing a chemical liquid process using a chemical liquid, and performs a rinsing process using a rinsing liquid, in a position where the object to be processed is raised higher relative to the liquid surface than a level set upon the chemical liquid process, and the method comprising the steps of: performing the chemical liquid process using the chemical liquid to the object to be processed in the processing tank; and after performing the chemical liquid process performing the rinsing process using the rinsing liquid, in the position where the object to be processed is raised higher relative to the liquid surface than the level set upon the chemical liquid process, while controlling the lifting mechanism by using the control section, so as to move and hold the supporting instrument.

The present invention is the liquid processing method described above, wherein the control section controls the lifting mechanism to raise the supporting instrument, such that a distance between the surface position of the rinsing liquid upon the rinsing process and the top end position of the object to be processed becomes shorter than a distance between the surface position of the chemical liquid upon the chemical liquid process and the top end position of the object to be processed.

The present invention is the liquid processing method described above, wherein the control section controls the lifting mechanism, so as to repeatedly raise and lower the supporting instrument upon the chemical liquid process, as well as to set an average position of the top end of the raised and lowered object to be processed as the top end position of the object to be processed upon the chemical liquid process.

The present invention is the liquid processing apparatus described above, wherein the control section controls the lifting mechanism, so as to repeatedly raise and lower the supporting instrument upon the chemical liquid process, as well as to set the highest position of the top end of the raised and lowered object to be processed as the top end position of the object to be processed upon the chemical liquid process.

The present invention is a liquid processing method using a liquid processing apparatus, the liquid processing apparatus including: a processing tank; a supporting instrument provided in the processing tank and configured to be raised and lowered, for supporting an object to be processed; a rinsing liquid supply section for supplying a rinsing liquid into the processing tank; a lifting mechanism configured to raise and lower the supporting instrument; and a control section for controlling the lifting mechanism and the rinsing liquid supply section, wherein the control section controls the lifting mechanism, so as to move and hold the supporting instrument, such that a distance between the surface position of the rinsing liquid and a top end position of the object to be processed becomes shorter than a distance between the bottom face position of the rinsing liquid and a bottom end position of the object to be processed, and the method comprising the steps of: supplying the rinsing liquid into the processing tank, and dipping the object to be processed in the rinsing liquid; and performing the rinsing process, while controlling the lifting mechanism so as to move and hold the supporting instrument, such that the distance between the surface position of the rinsing liquid and the top end position of the object to be processed becomes shorter than the distance between the bottom face position of the rinsing liquid and the bottom end position of the object to be processed.

The present invention is a computer program for driving a computer to execute a liquid processing method using a liquid processing apparatus, the liquid processing apparatus including: a processing tank; a supporting instrument provided in the processing tank and configured to be raised and lowered, for supporting an object to be processed; a chemical liquid supply section for supplying a chemical liquid into the processing tank; a rinsing liquid supply section for supplying a rinsing liquid into the processing tank; a lifting mechanism configured to raise and lower the supporting instrument; and a control section for controlling the lifting mechanism, the chemical liquid supply section and the rinsing liquid section, wherein the control section controls the lifting mechanism, so as to move and hold the supporting instrument after performing a chemical liquid process using a chemical liquid, and performs a rinsing process using a rinsing liquid, in a position where the object to be processed is raised higher relative to the liquid surface than a level set upon the chemical liquid process, and the method comprising the steps of: providing the chemical liquid process using the chemical liquid to the object to be processed in the processing tank; and after performing the chemical liquid process, performing the rinsing process using the rinsing liquid, in the position where the object to be processed is raised higher relative to the liquid surface than the level set upon the chemical liquid process, while controlling the lifting mechanism by using the control section, so as to move and hold the supporting instrument.

The present invention is the computer program described above, wherein the control section controls the lifting mechanism to raise the supporting instrument, such that a distance between the surface position of the rinsing liquid upon the rinsing process and the top end position of the object to be processed becomes shorter than a distance between the surface position of the chemical liquid upon the chemical liquid process and the top end position of the object to be processed.

The present invention is the computer program described above, wherein the control section controls the lifting mechanism, so as to repeatedly raise and lower the supporting instrument upon the chemical liquid process, as well as to set an average position of the top end of the raised and lowered object to be processed as the top end position of the object to be processed upon the chemical liquid process.

The present invention is the computer program described above, wherein the control section controls the lifting mechanism, so as to repeatedly raise and lower the supporting instrument upon the chemical liquid process, as well as to set the top end position of the object to be processed upon the chemical liquid process as the highest position of the top end of the raised and lowered object to be processed.

The present invention is a computer program for driving a computer to execute a liquid processing method using a liquid processing apparatus, the liquid processing apparatus including: a processing tank; a supporting instrument provided in the processing tank and configured to be raised and lowered, for supporting an object to be processed; a rinsing liquid supply section for supplying a rinsing liquid into the processing tank; a lifting mechanism configured to raise and lower the supporting instrument; and a control section for controlling the lifting mechanism and the rinsing supply section, wherein the control section controls the lifting mechanism, so as to move and hold the supporting instrument, such that a distance between the surface position of the rinsing liquid and a top end position of the object to be processed becomes shorter than a distance between the bottom face position of the rinsing liquid and a bottom end position of the object to be processed, and the method comprising the steps of: supplying the rinsing liquid into the processing tank, and dipping the object to be processed in the rinsing liquid; and performing the rinsing process, while controlling the lifting mechanism so as to move and hold the supporting instrument, such that the distance between the surface position of the rinsing liquid and the top end position of the object to be processed becomes shorter than the distance between the bottom face position of the rinsing liquid and the bottom end position of the object to be processed.

The present invention is a storage medium for storing a computer program for driving a computer to execute a liquid processing method using a liquid processing apparatus, the liquid processing apparatus including: a processing tank; a supporting instrument provided in the processing tank and configured to be raised and lowered, for supporting an object to be processed; a chemical liquid supply section for supplying a chemical liquid into the processing tank; a rinsing liquid supply section for supplying a rinsing liquid into the processing tank; a lifting mechanism configured to raise and lower the supporting instrument; and a control section for controlling the lifting mechanism, the chemical liquid supply section and the rinsing liquid supply section, wherein the control section controls the lifting mechanism, so as to move and hold the supporting instrument after performing a chemical liquid process using a chemical liquid, and performs a rinsing process using a rinsing liquid, in a position where the object to be processed is raised higher relative to the liquid surface than a level set upon the chemical liquid process, and the method comprising the steps of: performing the chemical liquid process using the chemical liquid to the object to be processed in the processing tank; and after performing the chemical liquid process, performing the rinsing process using the rinsing liquid, in the position where the object to be processed is raised higher relative to the liquid surface than the level set upon the chemical liquid process, while controlling the lifting mechanism by using the control section, so as to move and hold the supporting instrument.

The present invention is the storage medium described above, wherein the control section controls the lifting mechanism to raise the supporting instrument, such that a distance between the surface position of the rinsing liquid upon the rinsing process and the top end position of the object to be processed becomes shorter than a distance between the surface position of the chemical liquid upon the chemical liquid process and the top end position of the object to be processed.

The present invention is the storage medium described above, wherein the control section controls the lifting mechanism, so as to repeatedly raise and lower the supporting instrument upon the chemical liquid process, as well as to set an average position of the top end of the raised and lowered object to be processed as the top end position of the object to be processed upon the chemical liquid process.

The present invention is the storage medium described above, wherein the control section controls the lifting mechanism, so as to repeatedly raise and lower the supporting instrument upon the chemical liquid process, as well as to set the highest position of the top end of the raised and lowered object to be processed as the top end position of the object to be processed upon the chemical liquid process.

The present invention is a storage medium for storing a computer program for driving a computer to execute a liquid processing method using a liquid processing apparatus, the liquid processing apparatus including: a processing tank; a supporting instrument provided in the processing tank and configured to be raised and lowered, for supporting an object to be processed; a rinsing liquid supply section for supplying a rinsing liquid into the processing tank; a lifting mechanism configured to raise and lower the supporting instrument; and a control section for controlling the lifting mechanism and the rinsing liquid supply section, wherein the control section controls the lifting mechanism, so as to move and hold the supporting instrument, such that a distance between the surface position of the rinsing liquid and a top end position of the object to be processed becomes shorter than a distance between the bottom face position of the rinsing liquid and a bottom end position of the object to be processed, and the method comprising the steps of: supplying the rinsing liquid into the processing tank, and dipping the object to be processed in the rinsing liquid; and performing the rinsing process, while controlling the lifting mechanism so as to move and hold the supporting instrument, such that the distance between the surface position of the rinsing liquid and the top end position of the object to be processed becomes shorter than the distance between the bottom face position of the rinsing liquid and the bottom end position of the object to be processed.

Accordingly, the present invention can provide the following effects.

In the present invention, the distance between the surface of the rinsing liquid upon the rinsing process and the top end of the object to be processed is shortened. Thus, the amount of the rinsing liquid existing between the surface of the rinsing liquid and the top end of the object to be processed can be reduced, as such the amount of dissolution of nitrogen gas and/or carbon dioxide gas from the air into the rinsing liquid can also be reduced. Consequently, the time required for the specific resistance of the rinsing liquid to be raised up to a predetermined value can be shortened, thereby shortening the time required for the cleaning process and enhancing the throughput of manufacturing semiconductor wafers or liquid crystal substrates.

DETAILED DESCRIPTION OF THE INVENTION

Examples

Hereinafter, one specific example of a liquid processing apparatus, a liquid processing method and a liquid processing program, according to the present invention, will be described with reference to the drawings. In the description below, while a case in which the present invention is applied to a substrate processing apparatus for providing a cleaning process and a drying process to a wafer as an object to be processed, this invention is not limited only to the substrate processing apparatus, but can be applied to various types of liquid processing apparatuses for performing a rinsing process.

Figure 1:
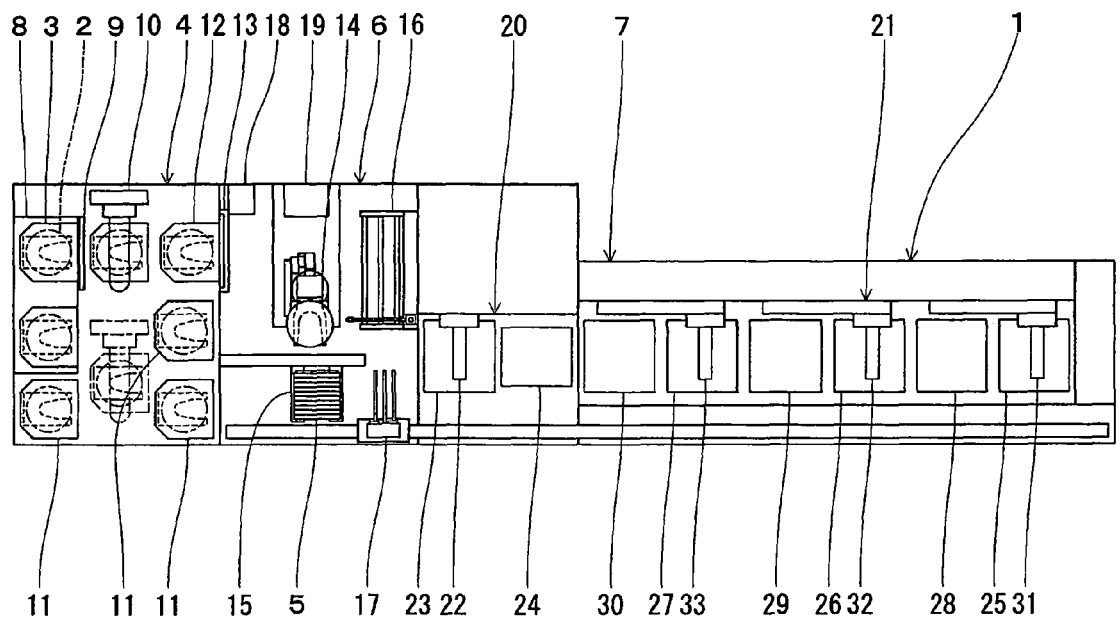
FIG. 1 is a plan view showing a substrate processing apparatus according to the present invention.

As shown in FIG. 1, a substrate processing apparatus 1 includes a carrier carrying-in and carrying-out section 4 for performing carrying-in and carrying-out of each carrier 3 containing multiple sheets of wafers 2 (substrates) therein, a batch constituting section 6 for constituting a batch 5 adapted to combine and collectively process the wafers 2 contained in a plurality of the carriers 3, and a substrate processing section 7 for providing a cleaning process and a drying process to the wafers 2 for each batch 5.

The carrier carrying-in and carrying-out section 4 includes a carrier stage 8 on which each carrier 3 is placed, an opening and closing door 9, a carrier transfer mechanism 10 provided on the inside of the opening and closing door 9, a carrier placing table 12, and carrier stocks 11. In this case, the carriers 3 placed on the carrier stage 8 are kept temporarily in the carrier stocks 11, as needed, by the carrier transfer mechanism 10, and are then carried onto the carrier placing table 12.

In the carrier carrying-in and carrying-out section 4, the carriers 3, each containing the wafers 2 having been subjected to a process in the substrate processing section 7, and carried onto the carrier placing table 12, will travel along a route reverse to that upon the carrying-in process, wherein they are kept temporarily in the carrier stocks 11, as needed, by the carrier transfer mechanism 10, and are then carried out onto the carrier stage 8.

The batch constituting section 6 includes an opening and closing door 13 which is provided between the batch constituting section 6 and the carrier carrying-in and carrying-out section 4, a substrate transfer mechanism 14 provided on the inside of the opening and closing door 13 and adapted to carry multiple sheets of wafers 2 contained in the carrier 3 at the same time, a batch constituting mechanism 15 for constituting the batch 5 by changing the interval of the arrangement of the wafers 2 to be carried into by the substrate transfer mechanism 14 into the half one, an arrangement order changing mechanism 16 for changing the order of arrangement of the wafers 2 to be carried into by the substrate transfer mechanism 14, and a batch transfer mechanism 17 adapted to transfer each batch 15 constituted by the batch constituting mechanism 15, between the batch constituting section 6 and the substrate processing section 7 as well as to carry the batch 15 the substrate processing section 7. In addition, the batch constituting section 6 includes a wafer containing state detecting sensor 18 for detecting a containing state of the wafer 2 contained in each carrier 3, and a notch aligner 19 adapted to adjust a position of a notch of each wafer 2 contained in each carrier 3.

In the batch constituting section 6 described above, each batch 5 is constituted by combining the multiple sheets (for example, 25 sheets for each carrier 3) of wafers 2 contained in the multiple (for example, two) carriers 3 carried out from the carrier carrying-in and carrying-out section 4, to properly rearrange the total number (for example, 50 sheets) of wafers 2, such that they will be processed collectively in the substrate processing section 7.

The substrate processing section 7 includes a cleaning and drying mechanism 20 adapted to clean and dry the wafers 2, and a cleaning mechanism 21 adapted to clean the wafers 2. The cleaning and drying mechanism 20 includes a liquid processing apparatus 23 adapted to clean and dry each batch 5 by lifting up and lowering it by using a lifting mechanism 22, and a cleaning apparatus 24 for cleaning the batch transfer mechanism 17. The cleaning mechanism 21 includes first to third chemical liquid tanks 25, 26, 27 each adapted to perform a chemical liquid process to the batch 5, first to third pure water tanks 28, 29, 30 each adapted to perform a pure water process to the batch 5, and first to third carrying apparatuses 31, 32, 33 each adapted to transfer the batch 5 between these first to third chemical liquid tanks 25, 26, 27 and the first to third pure water tanks 28, 29, 30.

The substrate processing section 7 includes the batch transfer mechanism 17 provided along the cleaning and drying mechanism 20 and cleaning mechanism 21, and a starting end of the batch transfer mechanism 17 is connected with the batch constituting section 6.

In the substrate processing section 7, the batch 5 constituted by the batch constituting section 6 is carried by the batch transfer mechanism 17 to the lifting mechanism 22 of the cleaning and drying mechanism 20 as well as to the first to third carrying apparatuses 31, 32, 33 associated with the cleaning mechanism 21 so as to perform a process to the wafers 2, for each batch 5, in the cleaning and drying mechanism 20 and in the cleaning mechanism 21. Thereafter, the processed batch 5 is transferred to the batch transfer mechanism 17 from the lifting mechanism 22 of the cleaning and drying mechanism 20 as well as from the first to third carrying apparatuses 31, 32, 33 associated with the cleaning mechanism 21, and the processed batch 5 is in turn carried to the batch constituting section 6 by the batch transfer mechanism 17.

In this manner, in the substrate processing apparatus 1, the wafers 2 are carried, by the carrier carrying-in and carrying-out section 4, into the batch constituting section 6, while being contained in each carrier 3. Subsequently, each batch 5 is constituted by the batch constituting section 6, and the batch 5 is then transferred to the substrate processing section 7 so that the wafers 2 can be collectively processed in the substrate processing section 7, while being properly rearranged in each batch 5. Specifically, the respectively predetermined processes are performed to each batch 5 in the substrate processing section 7, and the batch 5 is then transferred to the batch constituting section 6, where the wafers 2 contained in the batch 5 are placed again in each carrier 3. Thereafter, the carrier 3 is transferred to the carrier carrying-in and carrying-out section 4, and the carrier 3 is then carried out by the carrier carrying-in and carrying-out section 4, while containing the processed wafers 2 therein.

Figure 2:
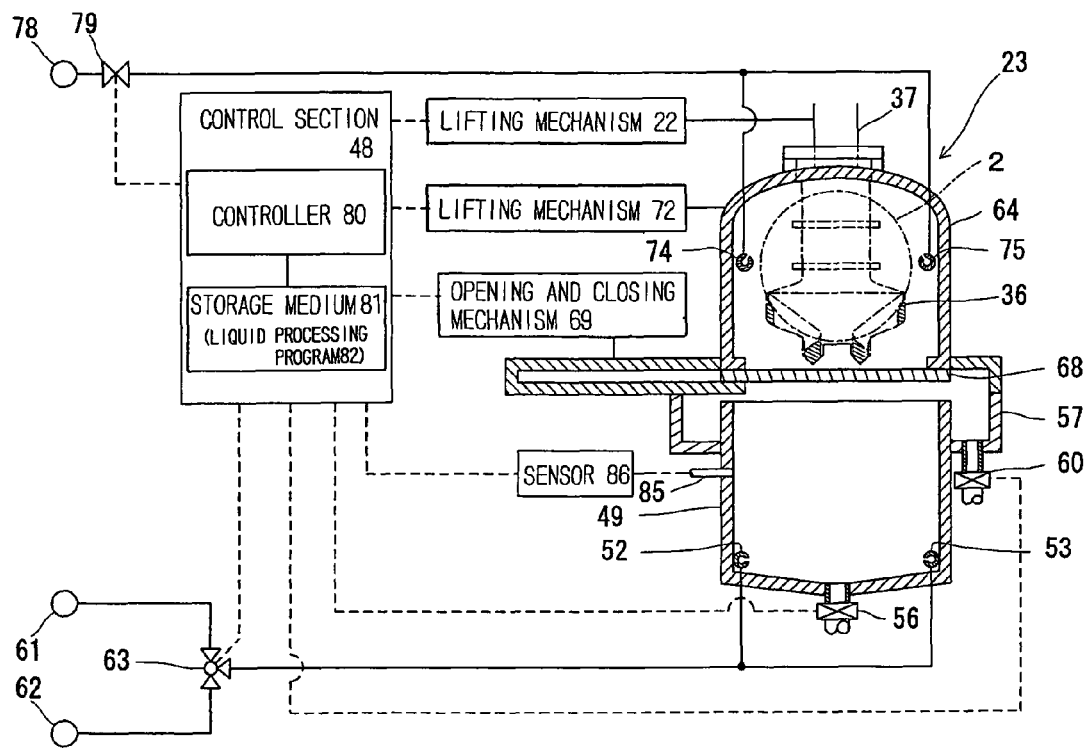
FIG. 2 is a block diagram showing a liquid processing apparatus.
Figures 3, 4:
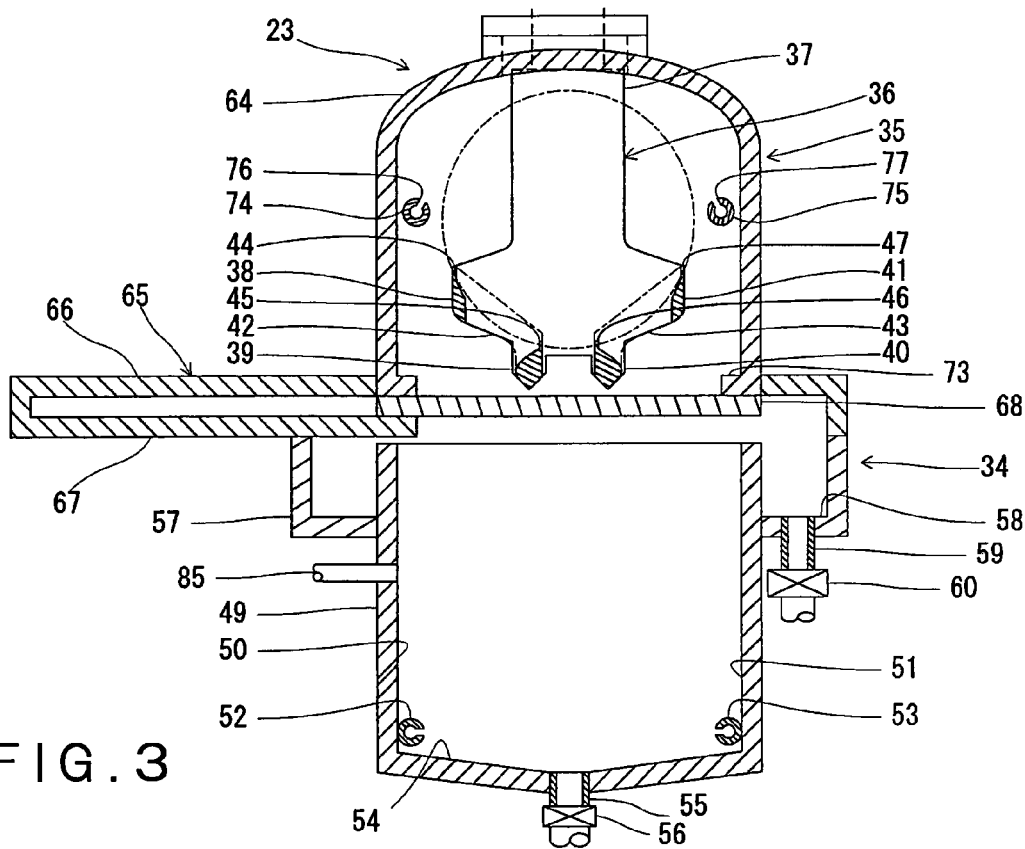
FIG. 3 is a front cross section view of the liquid processing apparatus in FIG. 2.
FIG. 4 is a side cross section view of the liquid processing apparatus in FIG. 2.

Next, the liquid processing apparatus 23, according to the present invention, will be described, with respect to its specific structure. The liquid processing apparatus 23, as shown in FIGS. 2 to 4, includes a cleaning unit 34 for cleaning the wafers 2 while they are contained in each batch 5, and a drying unit 35 for drying the wafers 2 while they are contained in each batch 5. The cleaning unit 34 and the drying unit 35 are integrally connected in the vertical direction. In a space defined by both of the cleaning unit 34 and the drying unit 35, a supporting instrument 36 adapted to raise and lower the wafers 2 between the units 34, 35 with the wafers 2 being contained in each batch 5, is provided such that it can be optionally moved in the vertical direction.

A specific structure of the supporting instrument 36 will now be described. The supporting instrument 36 includes an arm 37 extending in the vertical direction, and four supporting members 38, 39, 40, 41 each provided and attached to a front bottom end of the arm 37, in parallel with each other, with a constant gap provided therebetween in the left and right directions. In addition, a connecting member 42 (43) is provided between the left and right two supporting members 38, 39 (40, 41).

In a top end of each supporting member 38, 39, 40, 41 of the supporting instrument 36, supporting grooves 44, 45, 46, 47, each vertically supporting the wafers 2, are formed, with a constant gap provided therebetween in the forward and backward directions. Thus, by supporting the wafer 2 successively in each supporting groove 44, 45, 46, 47, multiple sheets of wafers 2 can be supported in parallel, with a constant gap provided therebetween in the forward and backward directions. The arm 37 of the supporting instrument 36 is connected with the lifting mechanism 22, so that the wafers 2 can be raised and lowered due by the supporting instrument 36 by using the lifting mechanism 22, between the cleaning unit 34 and the drying unit 35, while the wafers 2 are contained in each batch 5. A control section 48 is connected to the lifting mechanism 22, so that the lifting mechanism 22 is driven and controlled by the control section 48.

Next, a specific structure of the cleaning unit 34 will be described. The cleaning unit 34 includes a cleaning tank 49 with a rectangular box-like shape, having a bottom wall, an opening formed in a top end thereof, and cleaning liquid supply nozzles 52, 53 respectively provided at left and right side walls 50, 51 of the cleaning tank 49 and adapted to supply a cleaning liquid in an injected state. To the bottom wall 54 of the cleaning tank 49, a drain pipe 55 is connected to be in communication with the interior of the tank 49. In a middle portion of the drain pipe 55, an opening and closing valve 56 is provided. In addition, at an outer upper portion of the cleaning tank 49, an annular over-flow tank 57 is attached. A drain pipe 59 is connected with a bottom wall 58 of the over-flow tank 57 so as to be in communication with the interior of the over-flow tank 57, and an opening and closing valve 60 is provided in a middle portion of the drain pipe 59.

To the cleaning liquid supply nozzles 52, 53, a pure water supply source 61 for supplying pure water and a chemical liquid supply source 62 for supplying a chemical liquid are connected via a three-way cock 63, respectively. By changing the liquid flows by using the three-way cock 63, the pure water or chemical liquid can be supplied to the interior of the cleaning tank 49 from the respective cleaning liquid supply nozzles 52, 53. To the opening and closing valves 56, 60 as well as to the three-way cock 63, the control section 48 is connected, such that the opening and closing valve 56, 60 and the three-way cock 63 can be driven and controlled by the control section 48.

An aspiration tube 85 is connected with the cleaning tank 49 of the cleaning unit 34 so as to be in communication with the interior of the cleaning tank 49, and a sensor 86 is in turn connected with the aspiration tube 85, for detecting the specific resistance of the chemical liquid or rinsing liquid. Again, the sensor 86 is connected to the control section 48.

Next, a specific structure of the drying unit 35 will be described. The drying unit 35 includes a drying tank 64 with a generally box-like shape having an opening formed in a bottom end thereof, and a shutter mechanism 65 provided below the drying tank 64. The shutter mechanism 65 includes a casing 66 having a shutter containing portion 67 formed therein, such that a shutter 68 is contained in the shutter containing portion 67 so as to be optionally opened and closed.

In this embodiment, an opening and closing mechanism 69 is connected with the shutter 68 of the shutter mechanism 65 so as to be moved together. The opening and closing mechanism 69 is also connected to the control section 48, such that the opening and closing mechanism 69 can be driven and controlled by the control section 48.

The upper portion of the drying tank 64 of the drying unit 35 is formed to have a semicircular cross section, and has a through hole 70 at its top end, allowing the arm 37 of the supporting instrument 36 to be inserted therein. Around the through hole 70, a packing 71 is fitted. Thus, the drying tank 64 can be maintained in an airtighly sealed state, while the arm 37 is inserted therein.

In addition, a lifting mechanism 72 is connected with the drying tank 64 so as to be driven together, and the lifting mechanism 72 is also connected with the control section 48, thereby to drive and control the lifting mechanism 72 by the control section 48. When the drying tank 64 is lowered by the lifting mechanism 72, a flange 73 provided to a bottom end of the drying tank 64 is closely contacted with the shutter 68 of the shutter mechanism 65.

To inner upper portions of the drying tank 64 of the drying unit 35, a pair of left and right drying vapor supply nozzles 74, 75 are attached, for supplying drying vapor (IPA gas: isopropyl alcohol gas, etc.) in an injected state.

In the drying vapor supply nozzles 74, 75, gas discharging ports 76, 77, for discharging the drying vapor toward the inner upper portion of the drying tank 64, are respectively arranged, with a gap provided therebetween in the forward and backward directions.

A drying vapor source 78, for supplying the drying vapor with a carrier gas, is connected to the drying vapor supply nozzles 74, 75, via an opening and closing valve 79. By bringing the opening and closing valve 79 into an opened state, the drying vapor can be supplied into the drying tank 64 from the drying vapor supply nozzles 74, 75. The control section 48 is connected with the opening and closing valve 79, thereby driving and controlling the opening and closing valve 79 due to the control section 48.

The liquid processing apparatus 23 is constructed as described above, and is driven and controlled by the control section 48. In addition to the liquid processing apparatus 23, the control section 48 can also drive and control each section of the substrate processing apparatus 1. The control section 48 includes a controller 80 composed of a computer CPU, and a storage medium 81 connected with the controller 80. In the storage medium 81, various setting data, including a liquid processing program (computer program) 82, are stored. The storage medium 81 may be a memory, such as a ROM or RAM, or may be a disk-like storage medium, such as a hard disk or CD-ROM.

The control section 48 performs the cleaning process and the drying process for the wafers 2, successively, by driving and controlling the liquid processing apparatus 23, in accordance with a cleaning subroutine 83 and a drying subroutine 84 of the liquid processing program 82 stored in the storage medium 81.

Figure 5:
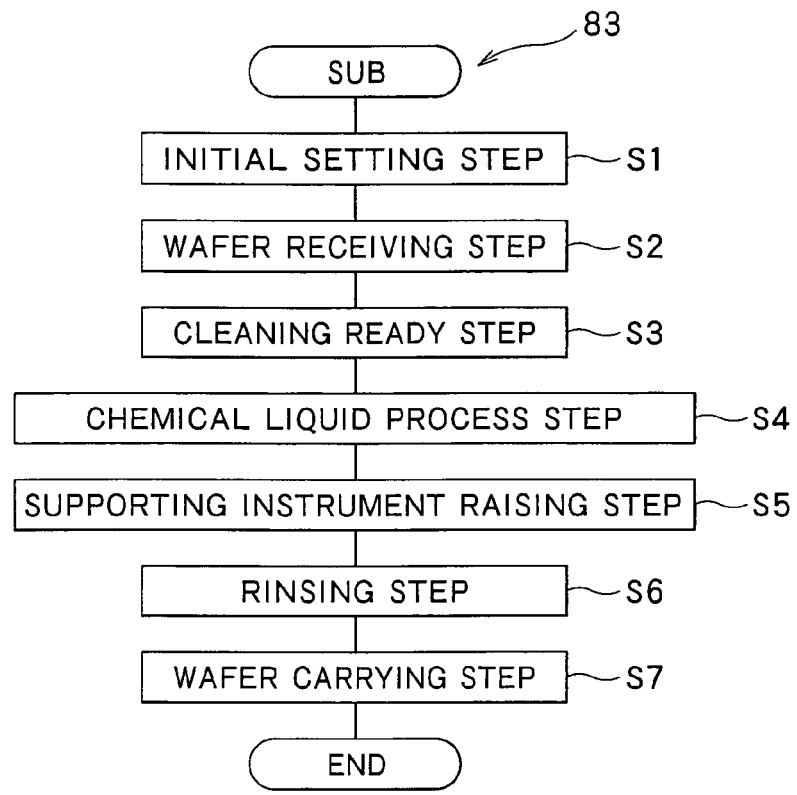
FIG. 5 is a flow chart of a cleaning subroutine.

First, in the cleaning subroutine 83, as shown in FIG. 5, initial setting of the liquid processing apparatus 23 is performed (initial setting step S1).

Figure 6:
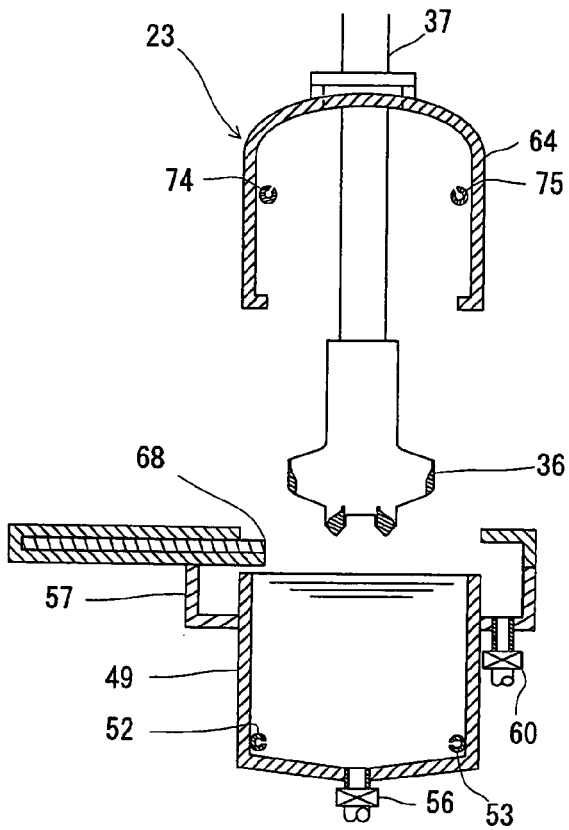
FIG. 6 is a view illustrating operation of the liquid processing apparatus (upon the initial setting).

Specifically, the control section 48, as shown in FIG. 6, brings the opening and closing valve 56 of cleaning tank 49 and the opening and closing valve 60 of over-flow tank 57 into closed states, respectively, while the control section 48 makes the shutter 68 into an opened state, by using the opening and closing mechanism 69. Subsequently, the control section 48 makes the supporting instrument 36 above the shutter mechanism 65, with a space, by using the lifting mechanism 22, and arranges the drying tank 64 above the supporting instrument 36, with a space, by using the lifting mechanism 72. Thereafter, the control section 48 makes pure water supplied into the cleaning tank 49, via the cleaning liquid supply nozzles 52, 53 of the cleaning tank 49, from the pure water supply source 61, by driving and controlling the three-way cock 63. At this time, the control section 48 makes the opening and closing valve 60 of the over-flow tank 57 into an opened state, so as to discharge over-flowing pure water from the cleaning tank 49.

In the cleaning subroutine 83, the supporting instrument 36 receives the batch 5 containing a plurality (for example, 50 sheets) of wafers 2 (wafer receiving step S2). This batch 5 has been constituted by the batch constituting section 6, as described above.

Figure 7:
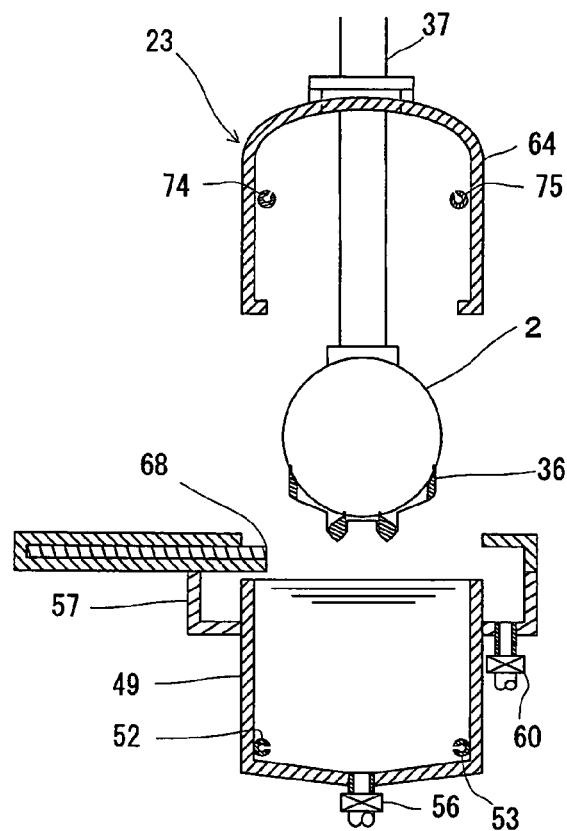
FIG. 7 is a view illustrating the operation of the liquid processing apparatus (upon receiving a wafer).

Specifically, the control section 48, as shown in FIG. 7, makes the wafers 2 constituting the batch 5, which has been carried by the batch transfer mechanism 17, onto the supporting grooves 44 to 47 provided in the supporting members 38 to 41 of the supporting instrument 36, by driving and controlling the batch transfer mechanism 17.

Subsequently, in the cleaning subroutine 83, the wafers 2 each placed on the supporting instrument 36 are dipped in pure water accumulated in the cleaning tank 49 (cleaning ready step S3).

Figure 8:
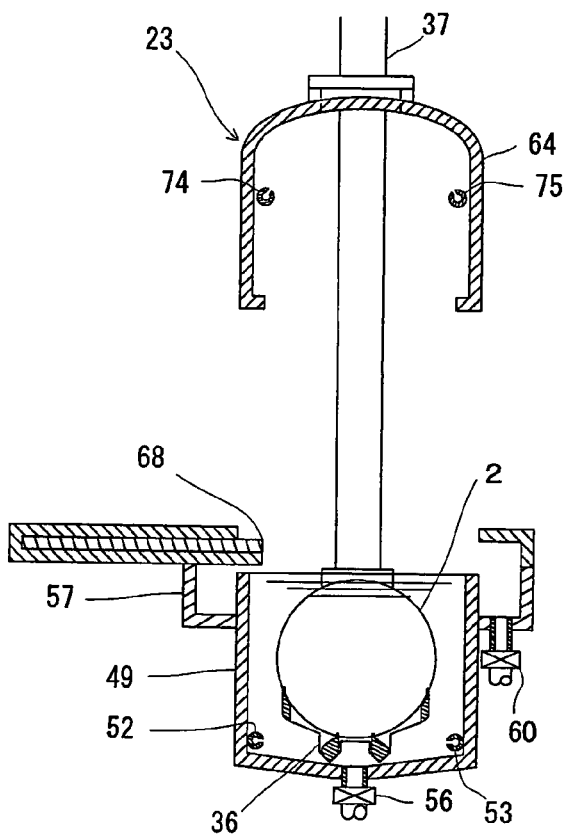
FIG. 8 is a view illustrating the operation of the liquid processing apparatus (upon a chemical liquid process).

Specifically, the control section 48, as shown in FIG. 8, makes the supporting instrument 36 lower into the interior of the cleaning tank 49, by using the lifting mechanism 22, so that the wafers 2 each placed on the supporting instrument 36 can be dipped in the pure water accumulated in the cleaning tank 49.

Thereafter, in the cleaning subroutine 83, the chemical liquid process for the wafers 2 is performed in the cleaning tank 49 (chemical liquid process step S4).

Specifically, while the control section 48 brings the opening and closing valve 56 of the cleaning tank 49 into a closed state and brings the opening and closing valve 60 of the over-flow tank 57 into an opened state, a chemical liquid (cleaning liquid) is supplied into the cleaning tank 49, via the cleaning liquid supply nozzle 52, 53 of the cleaning tank 49, from the chemical liquid supply source 62, by driving and controlling the three-way cock 63. Consequently, the pure water will gradually overflow from the cleaning tank 49 into the over-flow tank 57, and eventually the interior of the cleaning tank 49 will be filled with the chemical liquid. Thereafter, the wafers 2 are dipped in the chemical liquid accumulated in the cleaning tank 49, thereby performing the cleaning process (chemical liquid process).

Figure 10:
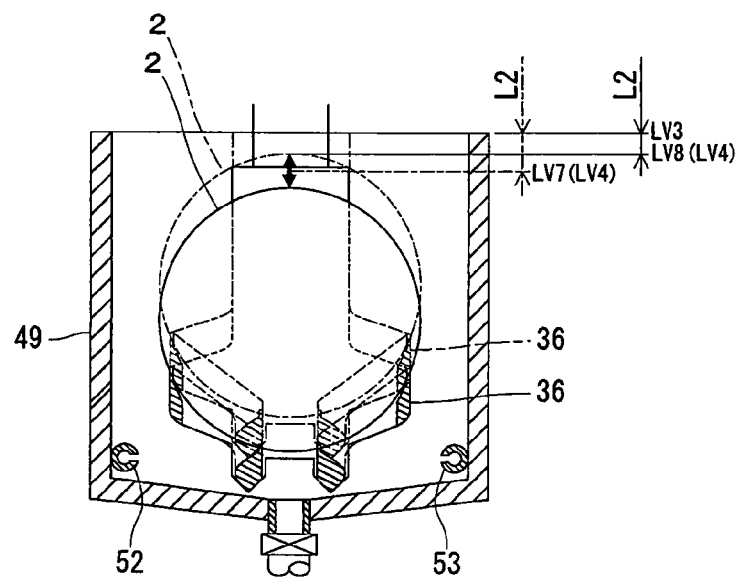
FIG. 10 is a view illustrating the operation of the liquid processing apparatus (upon lifting the wafer).

In the chemical liquid process (chemical liquid process step S4), in order to perform the chemical liquid process in a shorter time and more effectively, by increasing contact chances between the wafers 2 and the chemical liquid, a supporting instrument lifting step may be carried out, in which the supporting instrument 36 is repeatedly lifted up and lowered down so as to raise and lower the wafers 2 in the chemical liquid (see, FIG. 10).

Thereafter, in the cleaning subroutine 83, the supporting instrument 36 is raised in the interior of the cleaning tank 49 (supporting instrument raising step S5).

Figure 9:
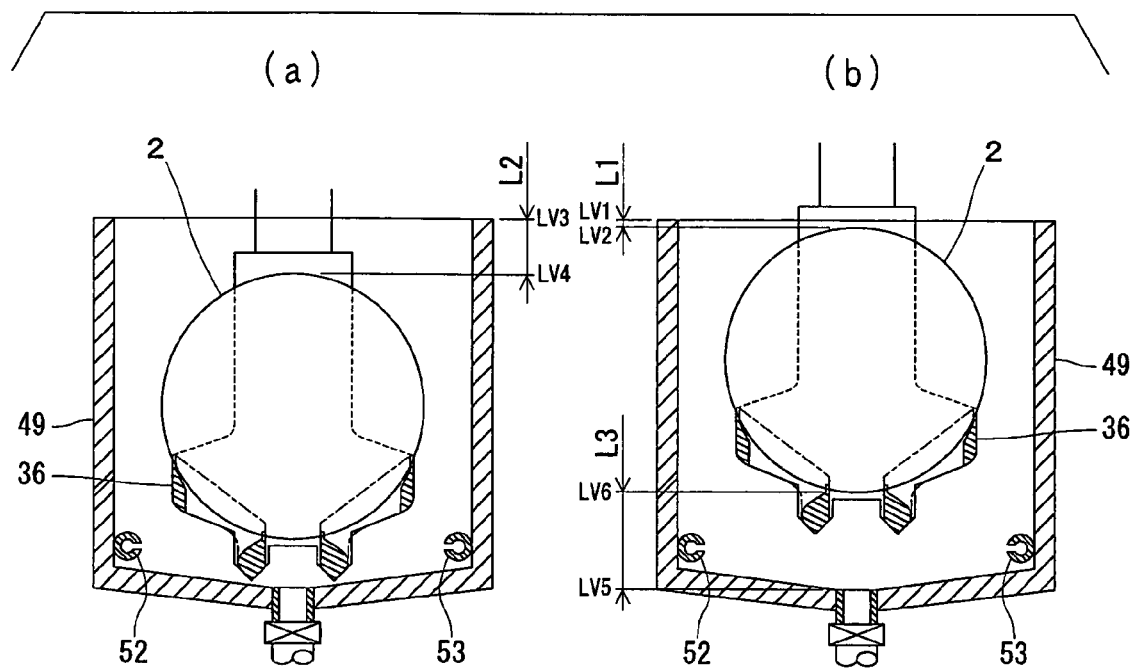
FIG. 9 is a view illustrating the operation of the liquid processing apparatus (upon a rinsing process).

Specifically, the control section 48, as shown in FIG. 9, makes the supporting instrument 36 rise in the interior of the cleaning tank 49, by using the lifting mechanism 22. At this time, the control section 48 raises the supporting instrument 36 rise such that a distance L1 from a liquid surface position LV1 of the rinsing liquid and a top end position LV2 of the wafers 2 becomes shorter than a distance L2 from a liquid surface position LV3 of the chemical liquid upon the chemical liquid process to a top end position LV4 of the wafers 2.

Subsequently, in the cleaning subroutine 83, the rinsing process for the wafers 2 is performed in the cleaning tank 49 (rinsing step S6).

Specifically, while the control section 48 brings the opening and closing valve 56 of the cleaning tank 49 into a closed state and brings the opening and closing valve 60 of the over-flow tank 57 is supplied into an opened state, it supplies pure water (cleaning liquid) into the cleaning tank 49, via the cleaning liquid supply nozzles 52, 53 of the cleaning tank 49, from the pure water supply source 61, by driving and controlling the three-way cock 63. Thus, the chemical liquid will gradually overflows from the cleaning tank 49 into the over-flow tank 57, and eventually the interior of the cleaning tank 49 will be filled with pure water. During this time, the wafers 2 are dipped in the pure water accumulated in the cleaning tank 49, thereby performing the cleaning process with water (rinsing process). This rinsing process is ended at a point of time the specific resistance to be detected by the sensor 86 reaches a predetermined value (e.g., 14M Ωcm).

In this embodiment, upon rinsing, the wafers 2 are raised by lifting up the supporting instrument 36, such that the distance L1 from the liquid surface position LV1 of the rinsing liquid and the top end position LV2 of the wafers 2 becomes shorter than the distance L2 from the liquid surface position LV3 of the chemical liquid upon the chemical liquid process to the top end position LV4 of the wafers 2. As such, the time (rinsing time) required for the specific resistance of the rinsing liquid to be raised up to the predetermined value can be reduced.

This is because by raising the wafers 2 using the supporting instrument 36, the amount of the rinsing liquid to be accumulated between the liquid surface of the rinsing liquid and the top end of the wafers 2 can be reduced, and therefore the amount of dissolution of nitrogen gas and/or carbon dioxide gas into the rinsing liquid from the air can be reduced.

Namely, when measuring the time required for the specific resistance of the rinsing liquid to be returned to 14M Ωcm while changing the position of the wafers 2, we have found that the recovery time of the specific resistance of the rinsing liquid can be reduced as the distance L1 from the liquid surface position LV1 of the rinsing liquid to the top end position LV2 of the wafers 2 is shortened. The results are shown in Table 1.

TABLE 1

Results of measuring the recovery time of the rinsing liquid

| | | Distance L1 (mm) | | |
| --- | --- | --- | --- | --- |
| | | 67 | 32 | 12 |
| | | (Distance L3 (mm)) | | |
| | | (59) | (80) | (100) |
| Time (seconds) | Including wafers | 940 | 900 | 850 |
| | No wafers | — | 1010 | 1020 |

In Table 1, the time required for the specific resistance of the rinsing liquid to be returned to 14M Ωcm was measured, in the case that the wafers 2 are placed on the supporting instrument 36, and in the case that the wafers are not placed thereon, under the conditions that the distance L2 from the liquid surface position LV3 of the chemical liquid upon the chemical liquid process to the top end position LV4 of the waters 2 was set at 67 mm, and the distance L1 from the liquid surface position LV1 of the rinsing liquid upon the rinsing process and the top end position LV2 of the wafers 2 was set at 67 mm, 32 mm, and 12 mm (and a distance L3 from a bottom face position LV5 of the rinsing liquid to a bottom end position LV6 of the wafers 2 was set at 50 mm, 80 mm, 100 mm).

From Table 1, it can be seen that in the state wherein the wafers 2 are placed on the supporting instrument 36, as the wafers 2 are raised together with the supporting instrument 36, such that the distance L1 from the liquid surface position LV1 of the rinsing liquid upon the rinsing process to the top end position LV2 of the wafers 2 is set at 67 mm, 32 mm, and 12 mm (and the distance L3 from the bottom face position LV5 of the rinsing liquid to the bottom end position LV6 of the wafers 2 is set at 50 mm, 80 mm, and 100 mm), the time required for the specific resistance of the rinsing liquid to be returned to 14M Ωcm is reduced depending on such setting values. On the other hand, in the state wherein the wafers 2 are not placed on the supporting instrument 36, substantially no change can be found in the time required for the specific resistance of the rinsing liquid to be returned to 14M Ωcm, even in the case wherein only the supporting instrument 36 is lifted up, such that the distance L1 from the liquid surface position LV1 of the rinsing liquid upon the rinsing to the top end position LV2 of the wafers 2 is set at 32 mm and 12 mm (and the distance L3 from the bottom face position LV5 of the rinsing liquid to the bottom end position LV6 of the wafers 2 is set at 80 mm and 100 mm).

From the results shown in Table 1, it was recognized that the amount of dissolution of nitrogen gas and/or carbon dioxide gas varies with the amount of the rinsing liquid existing between the surface of the rinsing liquid and the top end of each wafer 2, and therefore the time required for the specific resistance of the rinsing liquid to be raised up to a predetermined value can be shortened, by reducing the distance L1 between the surface position LV1 of the rinsing liquid and the top end position LV2 of the wafers 2, or by reducing the distance L1 between the surface position LV1 of the rinsing liquid and the top end position LV2 of the wafers 2 so that the distance L1 is shorter than the distance L3 between the bottom face position LV5 of the rinsing liquid and the bottom end position LV6 of each wafer 2.

Thus, the distance L1 between the surface position LV1 of the rinsing liquid and the top end position LV2 of the wafers 2 is shorter than the distance L2 between the surface position LV3 of the chemical liquid upon the chemical liquid process and the top end position LV4 of the waters 2, by lifting up the supporting instrument 36 in order to raise the wafers 2.

In addition, in the present invention, it is intended to reduce the distance L1 between the surface position LV1 of the rinsing liquid and the top end position LV2 of the wafers 2 so that the distance L1 is shorter than the distance L3 between the bottom face position LV5 of the rinsing liquid and the bottom end position LV6 of each wafer 2, by lifting up the supporting instrument 36 in order to raise the wafers 2.

Additionally, in the present invention, in the case of performing the supporting instrument lifting step, in which the supporting instrument 36 is repeatedly lifted up and lowered down, upon the chemical liquid process, as shown in FIG. 10, the supporting instrument 36 may be raised and lowered in the supporting instrument lifting step S5, by setting an average top end position LV7 of the raised and lowered wafers 2 as the top end position LV4 of the wafers 2 upon the chemical liquid process.

Furthermore, in the present invention, in the case of performing the supporting instrument lifting step, in which the supporting instrument 36 is repeatedly lifted up and lowered down, upon the chemical liquid process, as shown in FIG. 10, the supporting instrument 36 may be raised and lowered in the supporting instrument lifting step S5, by setting the highest position LV8 of the top ends of the raised and lowered wafers 2 as the top end position LV4 of the wafers 2 upon the chemical liquid process.

As described above, in the present invention, by lifting up the supporting instrument 36 in order to raise the wafers 2, the distance L1 between the surface position LV1 of the rinsing liquid and the top end position LV2 of the wafers 2 can be reduced so that the distance L1 is shorter than the distance L2 between the surface position LV3 of the chemical liquid upon the chemical liquid process and the top end position LV4 of the waters 2, or otherwise the distance L1 between the surface position LV1 of the rinsing liquid and the top end position LV2 of the wafers 2 can be reduced so that the distance L1 is shorter than the distance L3 between the bottom face position LV5 of the rinsing liquid and the bottom end position LV6 of each wafer 2. Thus, the amount of the rinsing liquid existing between the surface of the rinsing liquid and the top end of each wafer 2 can be reduced, and therefore the amount of dissolution of nitrogen gas and/or carbon dioxide gas from the air into the rinsing liquid can be reduced. Consequently, the time required for the specific resistance of the rinsing liquid to be raised up to a predetermined value (the time required for the rinsing process) can be shortened, thereby shortening the time required for the cleaning process and enhancing the throughput of manufacturing the semiconductor wafers or liquid crystal substrates.

It is noted that, in the present invention, the surface position LV1 of the rinsing liquid upon the rinsing process may be adjusted to be lower than the surface position LV3 of the chemical liquid upon the chemical liquid process, without lifting up the supporting instrument 36 between the chemical liquid process and the rinsing process. As a result, the distance L1 between the surface position LV1 of the rinsing liquid and the top end position LV2 of the wafers 2 can also be reduced so that the distance L1 is shorter than the distance L2 between the surface position LV3 of the chemical liquid upon the chemical liquid process and the top end position LV4 of the waters.

Finally, in the cleaning subroutine 83, the wafers 2 placed on the supporting instrument 36 are carried into the drying tank 64 from the cleaning tank 49 (wafer carrying step S7).

Figure 11:
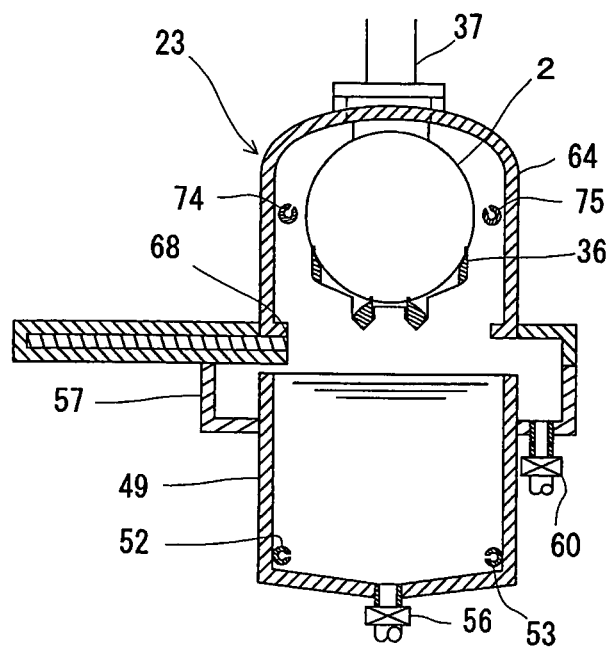
FIG. 11 is a view illustrating the operation of the liquid processing apparatus (upon carrying the wafer).

Specifically, the control section 48, as shown in FIG. 11, makes the drying tank 64 lower just above the shutter mechanism 65, by using the lifting mechanism 72. Subsequently, by lifting the supporting instrument 36, from the interior of the cleaning tank 49 up to the interior of the drying tank 64, by using the lifting mechanism 22, the wafers 2 placed on the supporting instrument 36 are carried into the drying tank 64.

Figure 12:
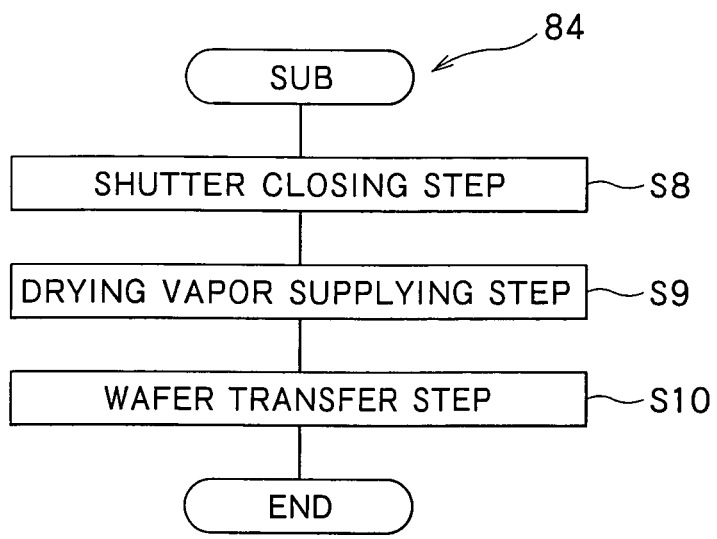
FIG. 12 is a flow chart of a drying subroutine.

Thereafter, in the drying subroutine 84, as shown in FIG. 12, the bottom end opening of the drying tank 64 is first closed by the shutter 68 of the shutter mechanism 65 (shutter closing step S8).

Figure 13:
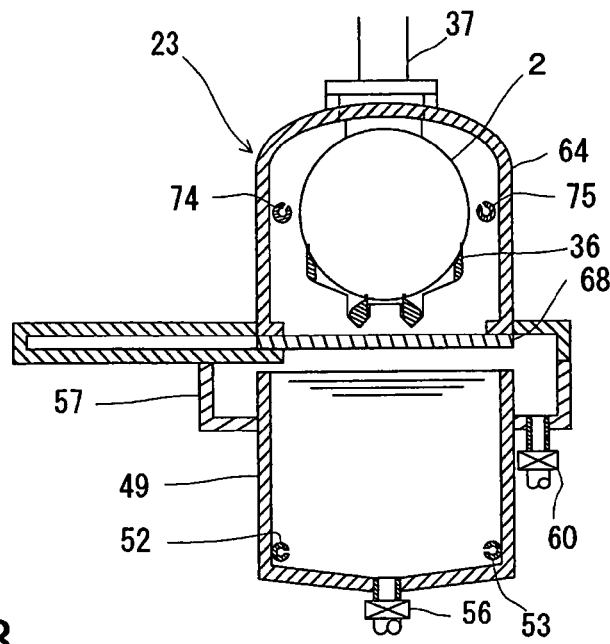
FIG. 13 is a view illustrating the operation of the liquid processing apparatus (upon a drying process).

Specifically, the control section 48, as shown in FIG. 13, brings the shutter 60 of the shutter mechanism 65 into a closed state, by using the opening and closing mechanism 69, so as to make the shutter 68 closely contact with the bottom end opening of the drying tank 64.

Subsequently, in the drying subroutine 84, drying vapor is supplied into the drying tank 64 (drying vapor supplying step S9).

Specifically, the control section 48 brings the opening and closing valve 79 into an opened state. Thus, the drying vapor set at a predetermined temperature is supplied into the drying tank 64 from the drying vapor supply source 78 via the discharging ports 76, 77 of the drying vapor supply nozzles 74, 75.

Finally, the drying subroutine 84 serves to transfer the wafers 2, having been subjected to both of the cleaning process and the drying process, into the batch transfer mechanism 17 (wafer transfer step S10).

Figure 14:
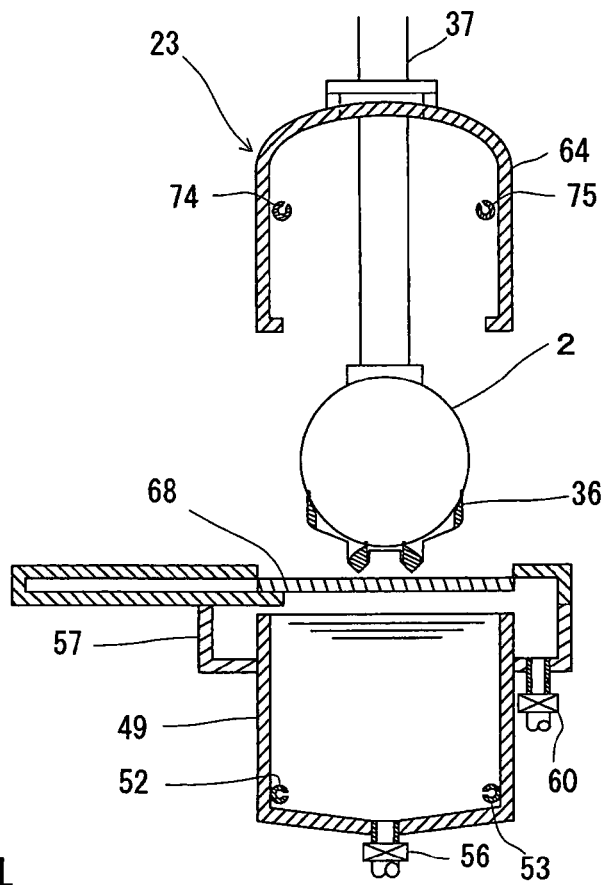
FIG. 14 is a view illustrating the operation of the liquid processing apparatus (upon transferring the wafer).

Specifically, the control section 48, as shown in FIG. 14, makes the drying tank 64 rise, by using the lifting mechanism 72, and then the wafers 2 are received from the supporting instrument 36 by the batch transfer mechanism 17.

The invention claimed is:

1. A computer program stored in a non-transitory computer readable medium programmed to drive a computer to execute a liquid processing method using a liquid processing apparatus, the liquid processing apparatus comprising:
a processing tank;
a supporting instrument provided in the processing tank and configured to be raised and lowered, for supporting an object to be processed;
a chemical liquid supply section for supplying a chemical liquid into the processing tank;
a rinsing liquid supply section for supplying a rinsing liquid into the processing tank;
a lifting mechanism configured to raise and lower the supporting instrument; and
a control section, having a processing unit, wherein the control section is programmed to control the lifting mechanism, the chemical liquid supply section and the rinsing liquid supply section,
wherein the control section is programmed to control the lifting mechanism, so as to move and hold the supporting instrument after performing a chemical liquid process using a chemical liquid, and performs a rinsing process using a rinsing liquid, in a lifted position where the object to be processed is raised higher relative to the rinsing liquid surface than a level set relative to the chemical liquid surface upon the chemical liquid process, and
wherein the computer program configures the computer to execute the liquid processing method by controlling the liquid processing apparatus to carry out the steps of:
performing the chemical liquid process by providing the chemical liquid to the object to be processed in the processing tank; and
after performing the chemical liquid process, controlling the lifting mechanism by the control section to position the object to be processed by,
(a) lifting the object to be processed to a lifted position where the object to be processed is raised higher relative to the rinsing liquid surface than a level set relative to the chemical liquid surface when the object to be processed is subjected to the chemical liquid process, and
(b) holding the object to be processed in the lifted position; and
performing the rinsing process using the rinsing liquid while the object to be processed is held in the lifted position.

2. The computer program according to claim 1, wherein the control section is programmed to control the lifting mechanism to raise the supporting instrument, such that a distance between the surface position of the rinsing liquid upon the rinsing process and the top end position of the object to be processed becomes shorter than a distance between the surface position of the chemical liquid upon the chemical liquid process and the top end position of the object to be processed.

3. The computer program according to claim 2, wherein the control section is programmed to control the lifting mechanism, so as to repeatedly raise and lower the supporting instrument upon the chemical liquid process, as well as to set an average position of the top end of the raised and lowered object to be processed as the top end position of the object to be processed upon the chemical liquid process.

4. The computer program according to claim 2, wherein the control section is programmed to control the lifting mechanism, so as to repeatedly raise and lower the supporting instrument upon the chemical liquid process, as well as to set the top end position of the object to be processed upon the chemical liquid process as the highest position of the top end of the raised and lowered object to be processed.

5. A non-transitory storage medium storing a computer program that programs the storage medium to drive a computer to execute a liquid processing method using a liquid processing apparatus, the liquid processing apparatus comprising:
a processing tank;
a supporting instrument provided in the processing tank and configured to be raised and lowered, for supporting an object to be processed;
a chemical liquid supply section for supplying a chemical liquid into the processing tank;
a rinsing liquid supply section for supplying a rinsing liquid into the processing tank;
a lifting mechanism configured to raise and lower the supporting instrument; and
a control section programmed to control the lifting mechanism, the chemical liquid supply section and the rinsing liquid supply section,
wherein the control section is programmed to control the lifting mechanism, so as to move and hold the supporting instrument after performing a chemical liquid process using a chemical liquid, and performs a rinsing process using a rinsing liquid, in a lifted position where the object to be processed is raised higher relative to the rinsing liquid surface than a level set relative to the chemical liquid surface upon the chemical liquid process, and
wherein the storage medium storing the computer program configures the computer to execute the liquid processing method by controlling the liquid processing apparatus to perform the steps of:
performing the chemical liquid process by providing the chemical liquid to the object to be processed in the processing tank; and
after performing the chemical liquid process, controlling the lifting mechanism by the control section to position the object to be processed by,
(a) lifting the object to be processed to a lifted position where the object to be processed is raised higher relative to the rinsing liquid surface than a level set relative to the chemical liquid surface when the object to be processed is subjected to the chemical liquid process, and
(b) holding the object to be processed in the lifted position; and performing the rinsing process using the rinsing liquid while the object to be processed is held in the lifted position.

6. The storage medium according to claim 5, wherein the control section is programmed to control the lifting mechanism to raise the supporting instrument, such that a distance between the surface position of the rinsing liquid upon the rinsing process and the top end position of the object to be processed becomes shorter than a distance between the surface position of the chemical liquid upon the chemical liquid process and the top end position of the object to be processed.

7. The storage medium according to claim 6, wherein the control section is programmed to control the lifting mechanism, so as to repeatedly raise and lower the supporting instrument upon the chemical liquid process, as well as to set an average position of the top end of the raised and lowered object to be processed as the top end position of the object to be processed upon the chemical liquid process.

8. The storage medium according to claim 6, wherein the control section is programmed to control the lifting mechanism, so as to repeatedly raise and lower the supporting instrument upon the chemical liquid process, as well as to set the highest position of the top end of the raised and lowered object to be processed as the top end position of the object to be processed upon the chemical liquid process.

9. A computer program stored in a non-transitory computer readable medium programmed to drive a computer to execute a liquid processing method using a liquid processing apparatus, the liquid processing apparatus comprising:
   a processing tank;
   a supporting instrument provided in the processing tank and configured to be raised and lowered, for supporting an object to be processed;
   a chemical liquid supply section for supplying a chemical liquid into the processing tank;
   a rinsing liquid supply section for supplying a rinsing liquid into the processing tank;
   a lifting mechanism configured to raise and lower the supporting instrument; and
   a control section, having a processing unit, wherein the control section is programmed to control the lifting mechanism, the chemical liquid supply section and the rinsing liquid supply section,
   wherein the control section is programmed to, after performing a chemical liquid process to an object to be processed using a chemical liquid, control the lifting mechanism to move and hold the supporting instrument in a lifted position and perform a rinsing process to the object to be processed using a rinsing liquid while the object to be processed is held in a lifted position in which a distance between a top end of the object to be processed and a liquid surface of the rinsing liquid is shorter than a distance between the top end of the object to be processed and a liquid surface of the chemical liquid during the chemical liquid process, and
   wherein the computer program configures the computer to execute the liquid processing method by controlling the liquid processing apparatus to carry out the steps of:
      performing the chemical liquid process by providing the chemical liquid to the object to be processed in the processing tank; and
      after performing the chemical liquid process, controlling the lifting mechanism by the control section to position the object to be processed by:
         (a) lifting the object to be processed to a lifted position in which a distance between a top end of the object to be processed and a liquid surface of the rinsing liquid is shorter than a distance between the top end of the object to be processed and a liquid surface of the chemical liquid during the chemical liquid process, and
         (b) holding the object to be processed in the lifted position; and
      performing the rinsing process using the rinsing liquid while the object to be processed is held in the lifted position.

10. A non-transitory storage medium storing a computer program that programs the storage medium to drive a computer to execute a liquid processing method using a liquid processing apparatus, the liquid processing apparatus comprising:
   a processing tank;
   a supporting instrument provided in the processing tank and configured to be raised and lowered, for supporting an object to be processed;
   a chemical liquid supply section for supplying a chemical liquid into the processing tank;
   a rinsing liquid supply section for supplying a rinsing liquid into the processing tank;
   a lifting mechanism configured to raise and lower the supporting instrument; and
   a control section programmed to control the lifting mechanism, the chemical liquid supply section and the rinsing liquid supply section,
   wherein the control section is programmed to control the lifting mechanism, after performing a chemical liquid process to an object to be processed using a chemical liquid, so as to move and hold the supporting instrument in a lifted position and perform a rinsing process to the object to be processed using a rinsing liquid while the object to be processed is held in a lifted position in which a distance between a top end of the object to be processed and a liquid surface of the rinsing liquid is shorter than a distance between the top end of the object to be processed and a liquid surface of the chemical liquid during the chemical liquid process, and
wherein the storage medium storing the computer program configures the computer to execute the liquid processing method by controlling the liquid processing apparatus to perform the steps of:
   performing the chemical liquid process by providing the chemical liquid to the object to be processed in the processing tank; and
   after performing the chemical liquid process, controlling the lifting mechanism by using the control section to position the object to be processed by,
      (a) lifting the object to be processed to a lifted position in which a distance between a top end of the object to be processed and a liquid surface of the rinsing liquid is shorter than a distance between the top end of the object to be processed and a liquid surface of the chemical liquid during the chemical liquid process, and
      (b) holding the object to be processed in the lifted position; and
   performing the rinsing process using the rinsing liquid while the object to be processed is held in the lifted position.

* * * * *